(12) United States Patent
Lee et al.

(10) Patent No.: US 7,417,874 B2
(45) Date of Patent: Aug. 26, 2008

(54) INFORMATION PROCESSING APPARATUS HAVING DETACHABLE FRONT AND REAR COVERS

(75) Inventors: Bong-ju Lee, Suwon-si (KR); Se-ki Jang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/530,084

(22) Filed: Sep. 8, 2006

(65) Prior Publication Data

US 2007/0058355 A1    Mar. 15, 2007

(30) Foreign Application Priority Data

Sep. 9, 2005    (KR)    ............... 10-2005-0084073

(51) Int. Cl.
*H05K 7/18*    (2006.01)
(52) U.S. Cl. ...................... 361/801; 378/156
(58) Field of Classification Search ............... 361/737, 361/801, 756; 455/90
See application file for complete search history.

(56) References Cited

U.S. PATENT DOCUMENTS 3,052,821 A * 9/1962 Scoville ............ 174/535
6,166,913 A * 12/2000 Fun et al. ............ 361/737
6,463,263 B1 * 10/2002 Feilner et al. ............ 455/90.1
6,947,288 B2 * 9/2005 Simmons et al. ............ 361/737
2003/0087611 A1 * 5/2003 Pan ............ 455/90

FOREIGN PATENT DOCUMENTS

KR    2001-75761    8/2001
KR    2003-58182    7/2003
KR    2003-72501    9/2003

OTHER PUBLICATIONS

Korean Office Action dated Oct. 17, 2006 issued in KR 2005-84073.

* cited by examiner

*Primary Examiner*—Dean A. Reichard
*Assistant Examiner*—Abiy Getachew
(74) *Attorney, Agent, or Firm*—Staanzione & Kim, LLP (57) ABSTRACT

An information processing apparatus includes a circuit unit, a front cover to support the circuit unit, a rear cover combined with the front cover with the circuit unit disposed therebetween, a skirt having a skirt body protruding from a surface of one of the front cover and the rear cover in a combining direction and an engaging slit formed on a surface of the skirt body in a horizontal direction of the combining direction, and an engaging protrusion having a protrusion protruding from a surface of the other one of the front cover and the rear cover to engage the engaging slit and a slant slanting to the surface of the other one of the front and rear covers from the protrusion.

24 Claims, 6 Drawing Sheets

//INFORMATION PROCESSING APPARATUS HAVING DETACHABLE FRONT AND REAR COVERS

CROSS-REFERENCE TO RELATED APPLICATIONS

This application claims priority under 35 U.S.C. §119(a) from Korean Patent Application No. 2005-0084073, filed on Sep. 9, 2005, in the Korean Intellectual Property Office, which is incorporated herein in its entirety by reference.

BACKGROUND OF THE INVENTION

1. Field of the Invention

The present general inventive concept relates to an information processing apparatus, and more particularly, to an information processing apparatus having an improved configuration of a front cover and a rear cover, thereby being detachable from each other without difficulties.

2. Description of the Related Art

An information processing apparatus is used to process information. An MP3 player, a personal digital assistant (PDA), a cellular phone, and a portable multimedia player (PMP) have been used as the information processing apparatus. The information processing apparatus comprises a display apparatus, such as a monitor, which displays a signal corresponding to the processed information inputted from an external signal source, such as a personal computer (PC).

The information processing apparatus comprises a front cover and a rear cover which are combined with each other. The front cover comprises a number of circuits mounted therein and the rear cover comprises an external casing combined with the front cover to protect the circuits disposed therebetween.

The display apparatus, such as the monitor, comprises a display, a front cover, a substrate, a shield, and a rear cover. The display forms an image thereon. The front cover is disposed in front of the display and supports the display. The substrate transmits an electrical signal or provides electric power to form the image on the display. The shield protects the substrate and blocks electromagnetic waves. The rear cover accommodates the display, the substrate, and the shield, and is combined with the front cover. The front cover and the rear cover are combined with each other to accommodate electronic components therein and have a detachable configuration for repair.

A conventional combined structure of a monitor case is disclosed in Korea Patent Publication No. 2003-72501, published on Sep. 15, 2003. The conventional monitor case comprises a latch of a hook shape protruding backward from a part of a rear surface of a front cover and a first guide boss protruding backward adjacent to the latch so as to assemble the front cover and a rear cover with a minimum number of screws. Also, the conventional monitor case comprises a holding groove unit provided in a part of a front surface of the rear cover to be correspondingly coupled to the latch and a second guide boss protruding forward adjacent to the holding groove unit so as to be inserted with the first guide boss. With this configuration, an end portion of the first guide boss of the front cover is inserted into the second guide boss of the rear cover. The first guide boss and the second guide boss allow the latch to be accurately combined with the holding groove unit, thereby assembling the front cover and the rear cover with the minimum number of screws.

However, the front cover and the rear cover are pressed to be spaced from each other while pressing a hook when disassembling the front and rear covers for repair in the conventional monitor case. Further, if the covers are excessively pressed to be disassembled, an engaging part such as the latch may be broken, so that the front and rear covers may not be securely re-coupled to each other. Also, the conventional monitor case needs screws for combination.

The screws are necessary to combine the front cover and the rear cover in a conventional information processing apparatus, so that the screws should be kept after the covers detached from each other. If the screws are lost, the covers are not securely coupled each other without the screws. Further, it takes too long to unscrew all the screws to disassemble the front and rear covers. Also, screw coupling parts of the cover made of a plastic material may be easily broken by an excessive force when combining and disassembling the front and rear covers with the screws.

SUMMARY OF THE INVENTION

The present general inventive concept provides an information processing apparatus having front and rear covers which are simply detachable and are efficiently prevented from being broken at a combining area thereof.

Additional aspects and advantages of the present general inventive concept will be set forth in part in the description which follows and, in part, will be obvious from the description, or may be learned by practice of the general inventive concept.

The foregoing and/or other aspects of the present general inventive concept may be achieved by providing an information processing apparatus comprising a circuit unit, a front cover to support the circuit unit, a rear cover to be combined with the front cover with the circuit unit disposed therebetween, a skirt comprising a skirt body protruding from a surface of one of the front cover and the rear cover in a combining direction and an engaging slit formed on a surface of the skirt body in a horizontal direction of the combining direction, and an engaging protrusion comprising a protrusion protruding from a surface of the other one of the front cover and the rear cover to engage the engaging slit, and a slant to slant with respect to the surface of the other one from the protrusion.

The engaging protrusion may comprise at least one rib protruding from a surface of the engaging protrusion.

A ratio between a width of the protrusion and a width of the slant is about 1.

The information processing apparatus may further comprise a stopper protruding from one of the front cover and the rear cover so as to keep the front cover and the rear cover stopping at a combining position.

The information processing apparatus may further comprise a jig accommodating part formed on the rear cover so as to accommodate a jig to separate the front cover from the rear cover.

The circuit unit may comprise a display to display an image thereon, and the front cover is formed with an opening to support and expose the display therethrough.

The foregoing and/or other aspects of the present general inventive concept may also be achieved by providing a display apparatus comprising a display displaying an image thereon, the display apparatus comprising a front cover formed with an opening to support and expose the display through the opening, a rear cover to be combined with the front cover with the display disposed therebetween, a skirt comprising a skirt body protruding from a surface of one of the front cover and the rear cover to be coupled with a surface of the other one of the front cover and the rear cover in a combining direction, and an engaging slit formed on a surface of the skirt body in a horizontal direction of the combining direction and having a width in the combining direction and a length in a direction having an angle with the combining direction, and an engaging protrusion comprising a protrusion protruding from a surface of the other one of the front cover and the rear cover to engage the engaging slit and a slant to slant from the protrusion to the surface of the other one of the front cover and the rear cover such that the protrusion and the slant of the engaging protrusion are inserted into the engaging slit when the front cover and the rear cover are combined.

The engaging protrusion may comprise at least one rib protruded from a surface of the engaging protrusion.

The rib slants with respect to an end portion of the engaging protrusion from a surface where the engaging protrusion is formed.

The engaging slit slants at a predetermined angle in a certain range corresponding to the rib so as to engage with the engaging protrusion.

A ratio between a width of the protrusion and a width of the slant is about 1.

The display apparatus may further comprise a stopper protruding from one of the front cover and the rear cover so as to keep the front cover and the rear cover stopping at a combining position.

The display apparatus may further comprise a jig accommodating part formed on the rear cover so as to accommodate a jig to separate the front cover from the rear cover.

The jig may have a plate shape, may have a smaller section area than the jig accommodating part, and may have a bent part in a center portion thereof.

The jig may comprise a jig protrusion protruding from a surface of the jig and allowing the jig to be inserted into the jig accommodating part of the rear cover to stop at the jig accommodating part.

The foregoing and/or other aspects of the present general inventive concept may also be achieved by providing a display apparatus comprising a display unit to display an image thereon, the display apparatus comprising a first cover, a second cover combined with the front cover to provide a space with the front cover to accommodate the display unit, a skirt comprising a skirt body formed on a first surface of the first cover in a combining direction when the front cover and the rear cover are combined in the combining direction, and an engaging slit formed on a surface of the skirt body in a direction having an angle with the combining direction, and an engaging protrusion comprising a protrusion formed on a surface of the second cover in the direction, and a slant slanting from a distal end of the protrusion to the surface of the second cover in the combining direction, such that the protrusion and the slant of the engaging protrusion are inserted into the engaging slit when the front cover and the rear cover are combined in the combined direction.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Hereinafter, an exemplary embodiment of the present general inventive concept will be described with a display apparatus as an example of an information processing apparatus. The information processing apparatus may comprise an MP3 player, a PDA, a cellular phone, a PMP, etc.

As illustrated in FIGS. 1 through 5, a display apparatus 10 according to an embodiment of the present general inventive concept comprises a display 20, a front cover 30, a rear cover 40, a skirt 45 (45a and/or 45b), an engaging slit 49 (49a and/or 49b), and an engaging protrusion 50 (50a and/or 50b). A printed circuit board (PCB) 23 may be disposed between the display 20 and the rear cover 40 to generate an image signal to be displayed on the display 20. A shield 25 may be disposed between the PCB 23 and the rear cover 40. The front cover 30 supports the display 20 which forms an image thereon and comprises an opening 31 to expose the display 20 therethrough. The rear cover 40 is coupled with the front cover 30 with the display 20 disposed therebetween. The display 20, the PCB 23, and the shield 25 may be called a display unit.

Figure 1:
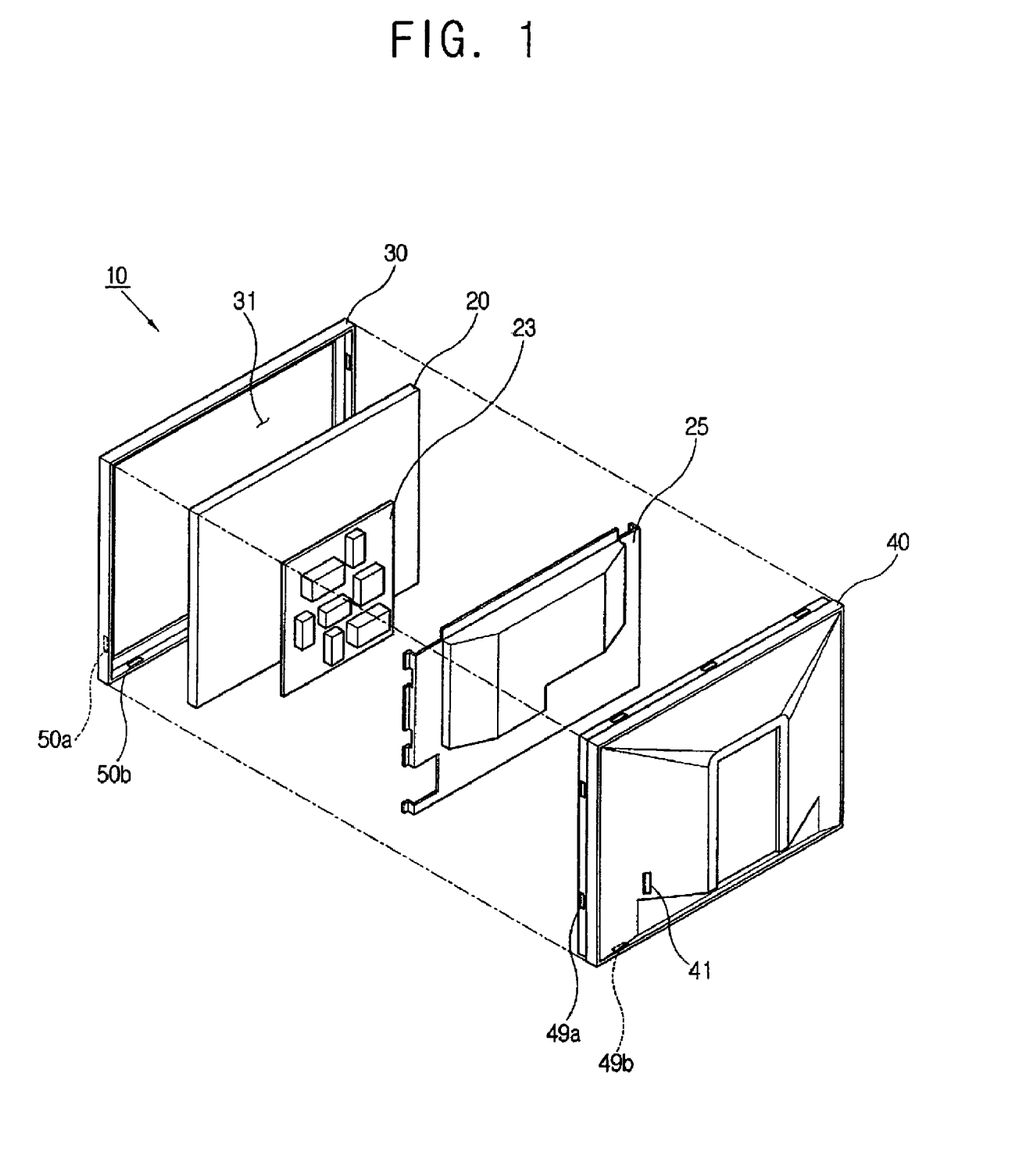
FIG. 1 is an exploded perspective view illustrating a display apparatus according to an embodiment of the present general inventive concept.
Figure 2:
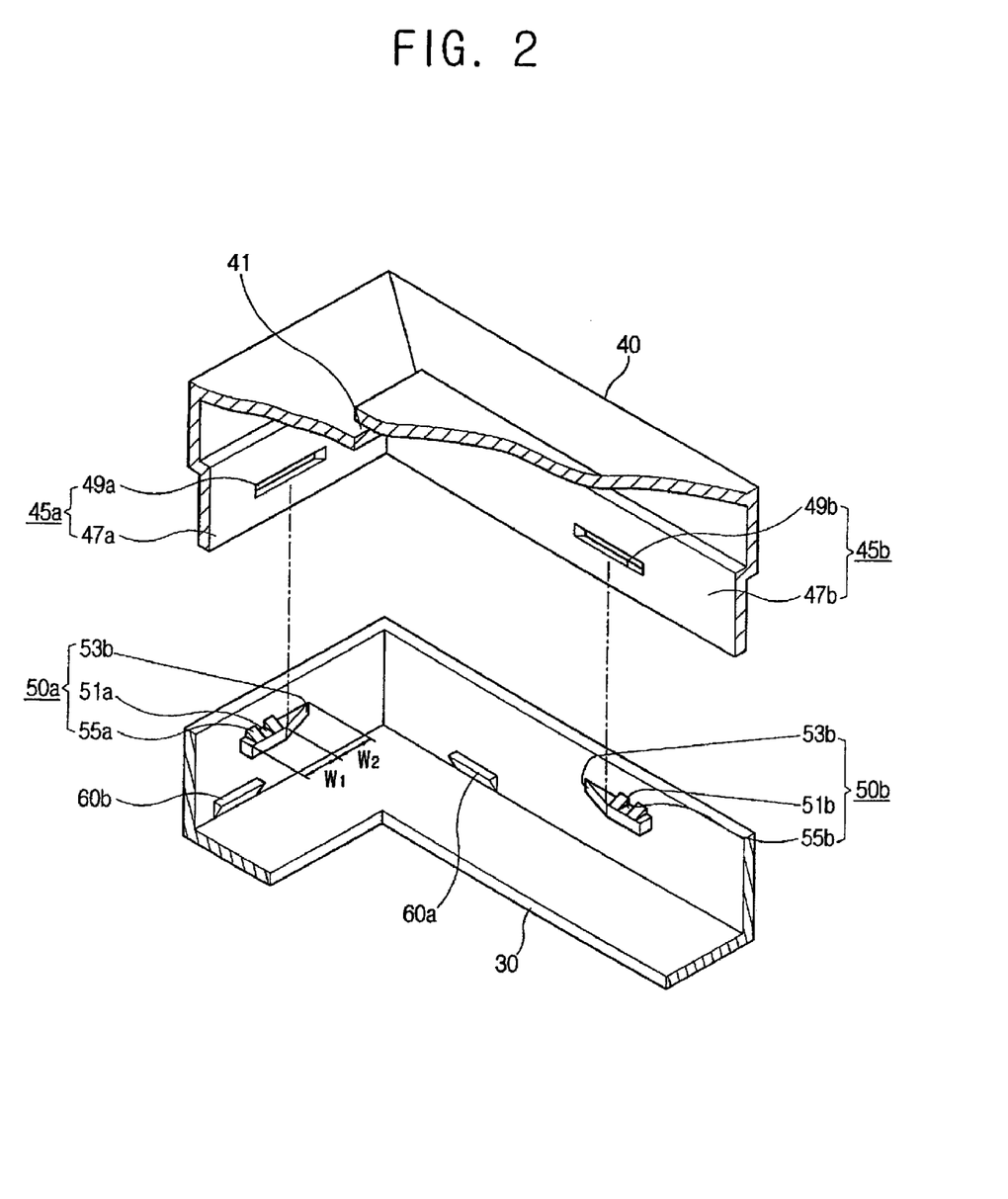
FIG. 2 is a partial sectional perspective view illustrating a skirt and an engaging protrusion of the display apparatus of FIG. 1.
Figure 3:
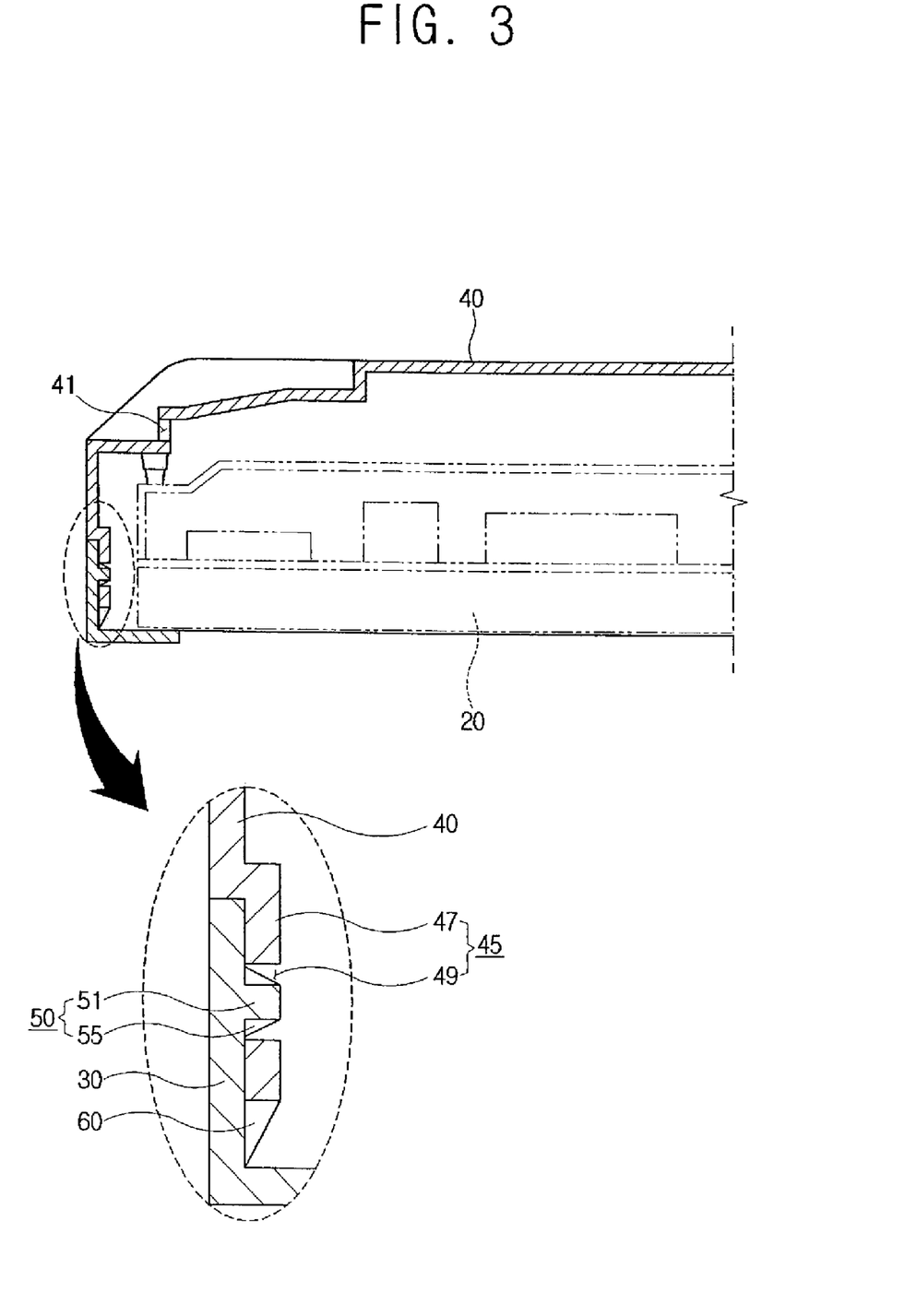
FIG. 3 is a partial sectional view illustrating a skirt of the display apparatus of FIG. 1.

Referring to FIGS. 1 and 2, the skirt 45 (45a and/or 45b) comprises a skirt body 47 (47a and/or 47b) protruding from a surface of one of the front cover 30 and the rear cover 40 in a combining direction and an engaging slit 49 (49a and/or 49b) formed on a surface of the skirt body 47 in a horizontal direction of the combining direction. The engaging protrusion 50 (50a and/or 50b) comprises a protrusion 51 (51a and/or 51b) protruding from a surface of the other one of the front cover 30 and the rear cover 40 to engage the engaging slit 49, a slant 53 to slant with respect to the surface of the other cover from the protrusion 51, and a slant rib 55 (55a and/or 55b). The display apparatus 10 may comprise a jig 70 to separate the front cover 30 from the rear cover 40. Also, the display apparatus 10 may comprise a supporting part (not shown) to support the front cover 30 and the rear cover 40 which are combined with each other, with respect to a reference surface, such as a table surface. The supporting part may comprise a conventional constitution to control the display apparatus 10 to be tilted or pivoted with respect to the reference surface.

The display 20 may comprise a display panel of a thin-plate shape such as a liquid crystal display (LCD) or a plasma display panel (PDP). The display 20 is combined with the front cover 30, thereby being supported.

The printed circuit board (PCB) 23 transmits an electric power and a signal to the display 20 to form an image, or supplies the electric power to a cooling fan to prevent a temperature inside the display 20 from rising.

The shield 25 is disposed between the PCB 23 and the rear cover 40 to protect the PCB 23 and to prevent electromagnetic waves generated in the PCB 23 from leaking to an outside thereof.

As illustrated in FIGS. 1 through 4, the front cover 30 supports the display 20 and is combined with the rear cover 40. The front cover 30 appears to an outside of the display apparatus 10 and is made of a metal material or a plastic material. The front cover 30 comprises the protrusion 51, the slant 53, and the slant rib 55 formed thereon. Also, the front cover 30 comprises a stopper 60 (60a and/or 60b) protruding in the combining direction thereon to keep the covers 30 and 40 stopping at a combining position. Further, in the information processing apparatus, a circuit (not shown), such as an image forming part, a power source, and a signal processing part may be disposed in the front cover 30.

The rear cover 40 is combined with the front cover 30. The display 20, the PCB 23 and the shield 25 are disposed between the rear cover 40 and the front cover 30. The rear cover 40 comprises the skirt body 47 protruding in the combining direction and the engaging slit 49 formed on the surface of the skirt body 47 in the horizontal direction of the combining direction. A jig accommodating part 41 is formed to pass through the rear cover 40 to accommodate the jig 70 therein which separates the rear cover 40 from the front cover 30. In the information processing apparatus, the circuit is disposed in a minimized space of the rear cover 40. Further, the information processing apparatus may comprise the jig accommodating part 41 if necessary to separate the front cover 30 and the rear cover 40.

The skirt 45 is formed with the skirt body 47 and the engaging slit 49 formed on the surface of the skirt body 47. It is possible that the skirt 45 may be provided on the front cover 30.

The skirt body 47 protrudes from a surface of the rear cover 40 in the combining direction to contact an inside surface of the front cover 30 and is formed with the engaging protrusion 50 to be inserted into the engaging slit 49 when the rear cover 40 is combined with the front cover 30.

Figure 4:
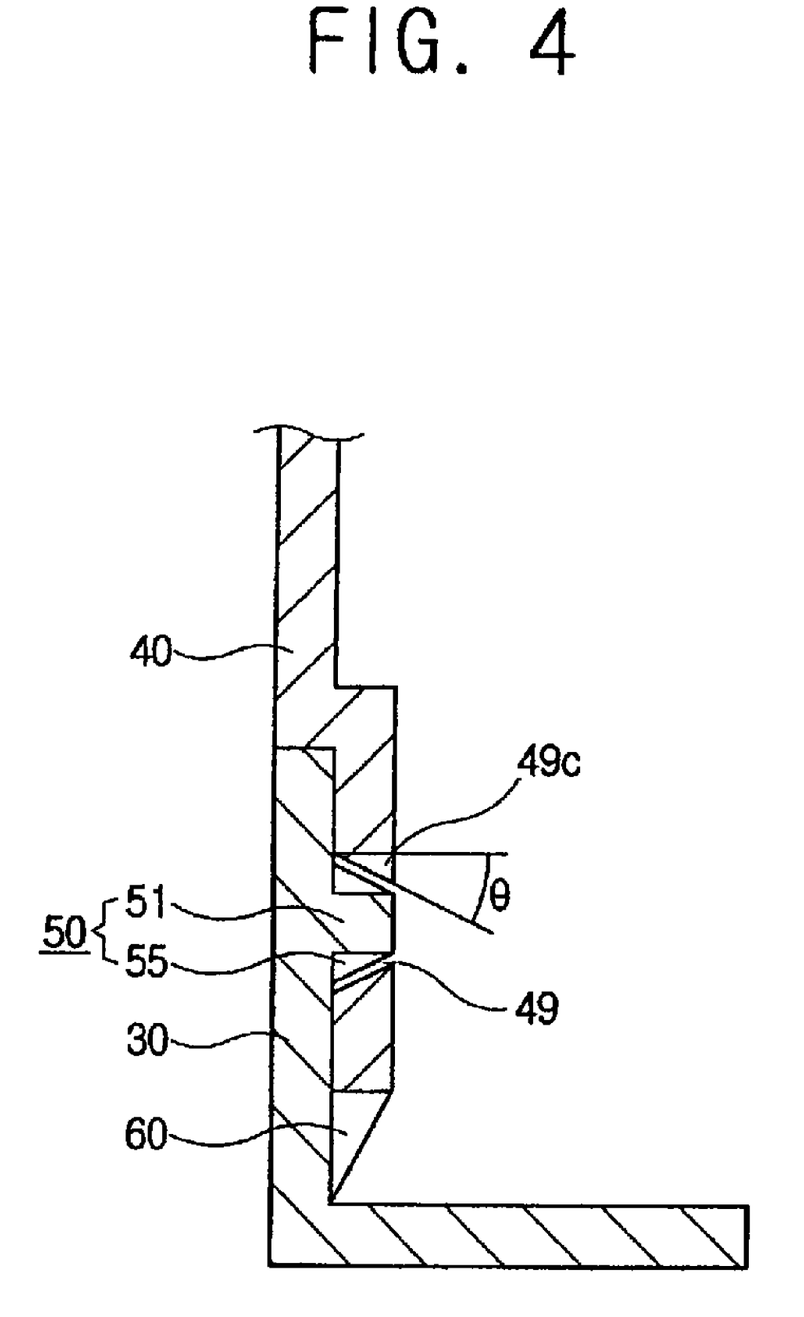
FIG. 4 is an enlarged sectional view illustrating an engaging slit of the display apparatus of FIG. 1.

The engaging slit 49 is formed on the surface of the skirt body 47 of the rear cover 40 in the horizontal direction of the combining direction such that a device is inserted from an outside to an inside of the front cover 30 and the rear cover 40 to separate the front cover 30 and the rear cover 40. The engaging slit 49 may be provided in the front cover 30. The engaging slit 49 may have a slant surface 49c slanting at a predetermined angle ("θ" in FIG. 4) corresponding to the slant rib 55 formed on the engaging protrusion 50, as illustrated in FIG. 4. As the slant surface 49c is formed on the engaging slit 49 to slant with respect to a major surface of the skirt body 47 facing the surface (i.e., a side) of the front cover 40, the front cover 30 is smoothly combined with and detached from the rear cover 40 in the horizontal direction of the combining direction. Also, damage on the engaging slit 49 and the engaging protrusion 50 can be efficiently decreased when combining and detaching the front and rear covers 30 and 40.

The engaging protrusion 50 comprises the protrusion 51 protruding from the surface of the front cover 30 to engage the engaging slit 49, and the slant 53 inclined with respect to the surface of the front cover 30 from the protrusion 51. In FIG. 2, a ratio between a width W1 of the protrusion 51 and a width W2 of the slant 53 may be 1:1 according to an external force occurring when combining and detaching the covers 30 and 40. However, the present general inventive concept is not limited thereto. It may be 1:2, 2:1, 1:3, 3:1 or the like according to a thickness, a height, and the number of the protrusion 51 and the slant 53. One or more engaging protrusions may be used as the engaging protrusion 50 if necessary according to a size, a weight or the like of the display 20. The slant 53 of the engaging protrusion 50 may be disposed to face toward the jig accommodating part 41 of the rear cover 40, thereby detaching the front cover 30 from the rear cover 40 gradually and smoothly. Accordingly, the covers 30 and 40 are gradually combined and detached by the slant 53 when combining and detaching the engaging protrusion 50 and the engaging slit 49, and thus damage on the engaging protrusion 50 can be efficiently decreased. The engaging protrusion 50 may be provided on the front cover 30 as well.

The rib 55 protrudes from a surface of the engaging protrusion 50, and one or more ribs can be provided as the rib 55. The rib 55 slopes to an end portion of the engaging protrusion 50 from the surface of the front cover 30.

Accordingly, the engaging protrusion 50 engages the engaging slit 49 using an inclined surface of the rib 55, so that the front cover 30 is securely combined with the rear cover 40 without an additional component, such as a screw. Furthermore, damage on the engaging protrusion 50 and the engaging slit 49 may decreased or prevented when being detached from each other.

The stopper 60 protrudes from the front cover 30 to keep the front cover 30 and the rear cover 40 stopping at the combining position where the engaging protrusion 50 is inserted into the engaging slit 49. The stopper 60 may be formed on the rear cover 40 as well. One or more stoppers can be used as the stopper 60 according to a size of electronic products or the like and can be disposed in a diagonal direction to a combining surface according to a balance of a force applied when the front cover 30 and the rear cover 40 is combined.

Figure 5:
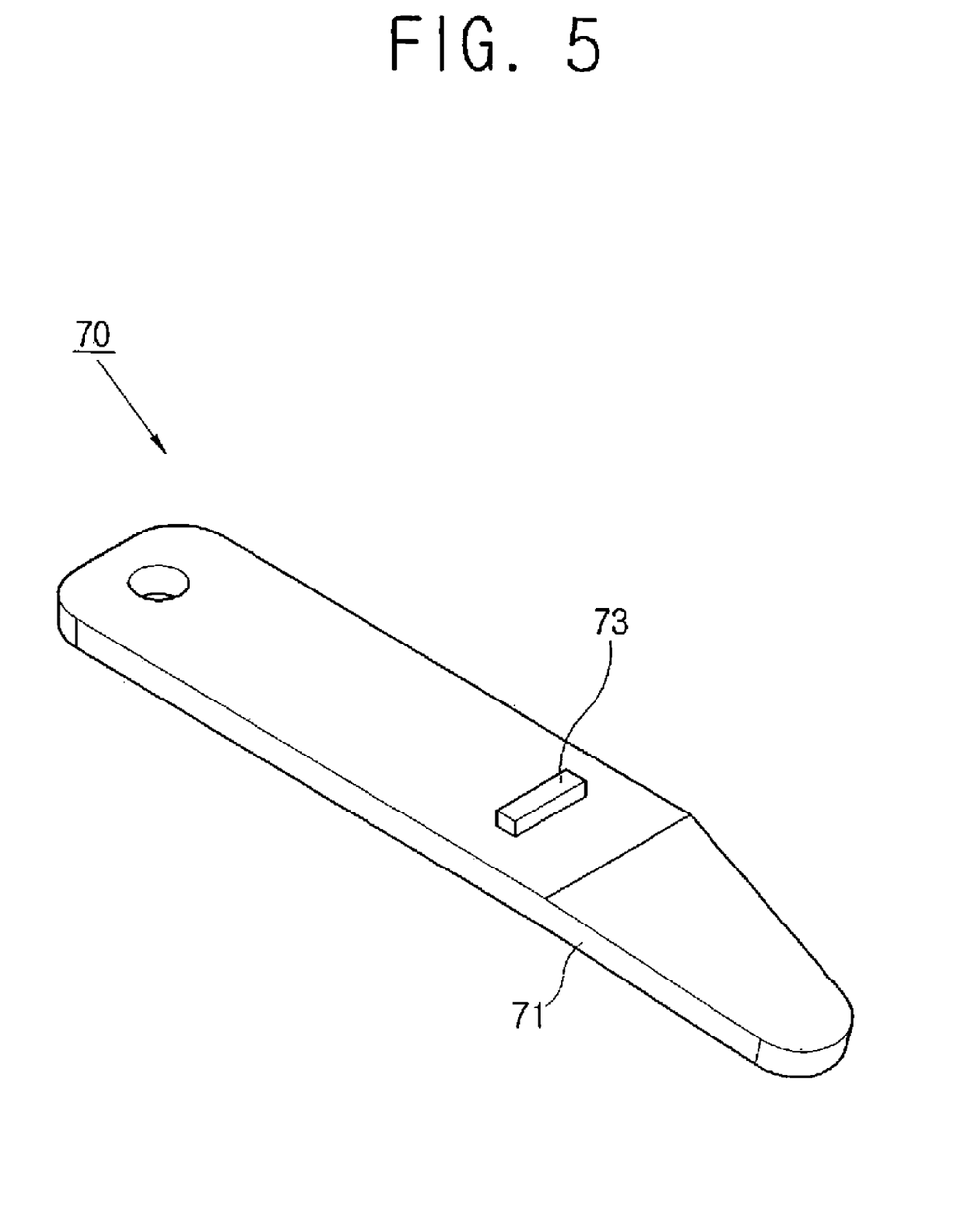
FIG. 5 is a perspective view illustrating a jig to disassemble the display apparatus of FIG. 1.

As illustrated in FIG. 5, the jig 70 has a plate shape to separate the front cover 30 from the rear cover 40. The jig 70 has a smaller cross-section area than the jig accommodating part 41 and comprises a bent part 71 in a center portion thereof. The jig 70 comprises a jig protrusion 73 protruding from a surface thereof. The jig 70 may comprise a screw driver.

Figure 6:
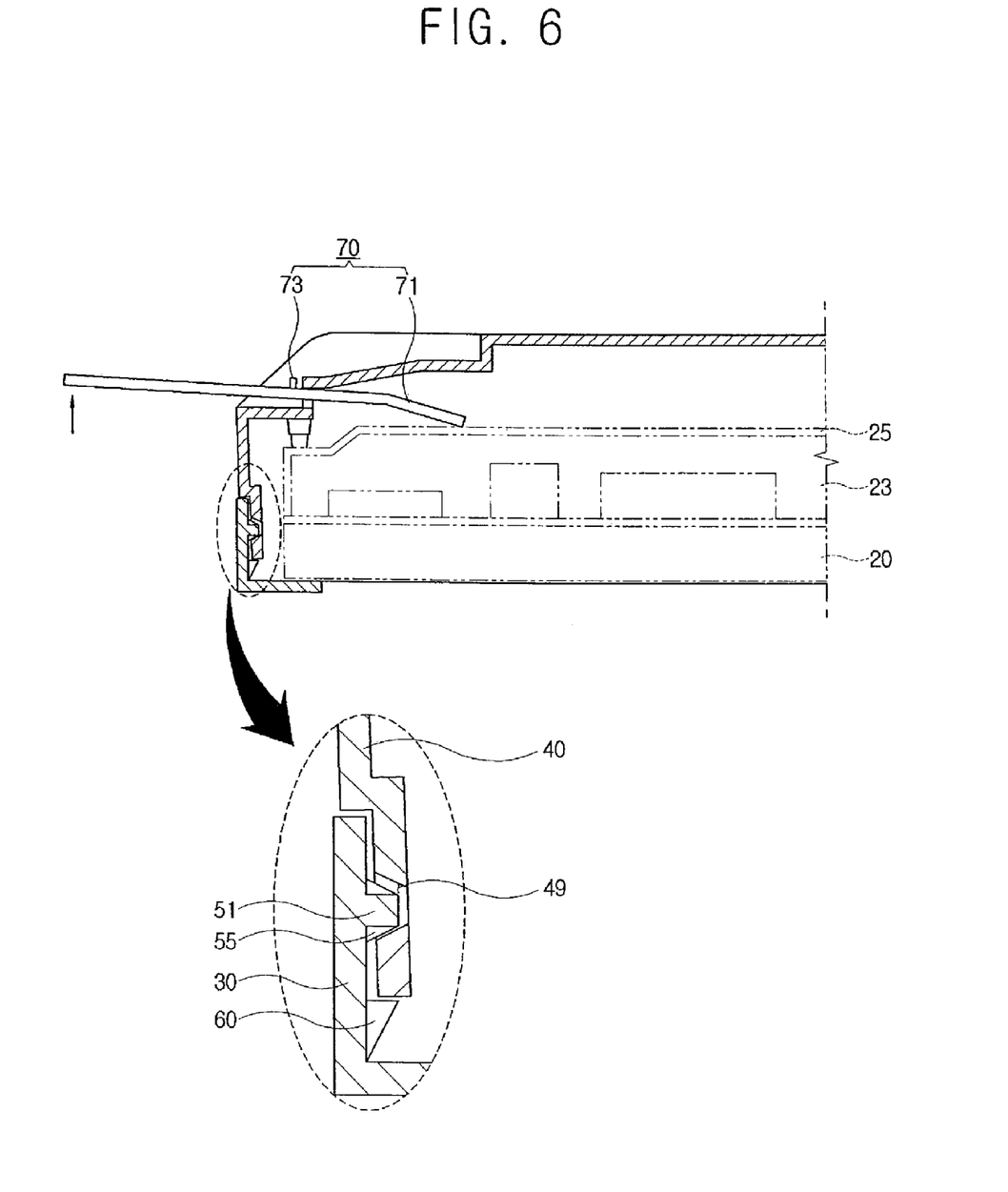
FIG. 6 is a schematic sectional view illustrating a disassembling process of the display apparatus of FIG. 1.

The jig protrusion 73 protrudes from the surface of the jig 70 to allow the jig 70 to be inserted into the jig accommodating part 41 of the rear cover 40 to stop at the jig accommodating part 41. The jig protrusion 73 may be disposed at different positions if necessary. Accordingly, the jig 70 may be seated on the shield 25 due to the jig protrusion 73 when inserted into the jig accommodating part 41 as illustrated in FIG. 6.

With this configuration, a process of combining and detaching the front and rear covers 30 and 40 of the display apparatus according to the present embodiment will be described as referring to FIG. 6.

First, the front cover 30 is combined with the rear cover 40 as follows. The display 20, the PCB 23, and the shield 25 are combined with one of the front cover 30 and the rear cover 40. The front cover 30 is put on a worktable, so that the engaging protrusion 50 of the front cover 30 faces upward. The skirt 45 of the rear cover 40 is disposed so that the engaging slit 49 of the rear cover 40 corresponds to the engaging protrusion 50 of the front cover 30. In this state, as the rear cover 40 is pressed to the front cover 30, the rear cover 40 gradually engages with the front cover 30 with the a slant surface of the rear cover 40 sliding on a slant surface of the rib 55, and then the two covers 30 and 40 are combined with each other. Meanwhile, the engaging protrusion 50 gradually engages with the engaging slit 49 by the slant 53 of the engaging protrusion 50 in the horizontal direction of the combining direction. Herein, the stopper 60 stops the front cover 30 and the rear cover 40 at a predetermined combining position.

Next, the front cover 30 is detached from the rear cover 40 as follows. The front cover 30 is put on the worktable, so that the rear cover 40 is disposed upward. Then, the jig 70 is inserted into the jig accommodating part 41 of the rear cover 40. The jig 70 is stopped by the jig protrusion 73 at a predetermined position, and then a distal end of the bent part 71 of the jig 70 is supported by the shield 41, which is relatively greater than other components in strength. When an end portion of the jig 70 is pressed or lifted up in an arrow direction with respect to the distal end of the jig 70, the jig accommodating part 41, or a portion of the front and rear covers 30 and 40, the slant 53 of the engaging protrusion 50 slides from the engaging slit 49 of the rear cover 40 and is gradually detached therefrom. Then, the front cover 30 is detached from the rear cover 40 without difficulties.

According to the embodiment of the present general inventive concept, the engaging protrusion 50 is gradually combined with and detached from the engaging slit 49 by the slant 53 formed on the engaging protrusion 50, thereby efficiently decreasing of the damage on the engaging protrusion 50 and the engaging slit 49. Further, a slant surface is formed on the engaging slit 49 corresponding to the slant rib 55 of the engaging protrusion 50, thereby efficiently combining and detaching the covers 30 and 40. Also, a screw is not necessary, thereby combining and detaching the covers 30 and 40 conveniently. The front cover 30 is also easily detached from the rear cover 40 with the jig 70.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. An information processing apparatus having a circuit unit, comprising:
    a front cover to support the circuit unit;
    a rear cover to be combined with the front cover in a combining direction and having the circuit unit disposed therebetween;
    a skirt comprising a skirt body protruding from a surface of one of the front cover and the rear cover in the combining direction and an engaging slit formed on a surface of the skirt body in a direction having an angle with the combining direction; and
    an engaging protrusion comprising a protrusion protruding from a surface of the other one of the front cover and the rear cover to engage the engaging slit of the skirt, and a slant slanting from a distal end of the protrusion to the surface of the other one of the front cover and the rear cover,
    wherein the engaging protrusion comprises at least one rib protruding from a surface of the engaging protrusion, and the engaging protrusion is inserted into the engaging slit.

2. The information processing apparatus according to claim 1, wherein a ratio between a width of the protrusion and a width of the slant is about 1.

3. The information processing apparatus according to claim 1, further comprising:
    a stopper protruding from one of the front cover and the rear cover so as to keep the front cover and the rear cover stopping at a combining position.

4. The information processing apparatus according to claim 1, further comprising:
    a jig accommodating part formed in one of the rear cover and the front cover so as to accommodate a jig to separate the front cover from the rear cover.

5. The information processing apparatus according to claim 1, wherein the circuit unit comprises a display to display an image thereon, and the front cover is formed with an opening to support and expose the display.

6. A display apparatus comprising a display to display an image thereon, comprising:
    a front cover formed with an opening supporting and exposing the display;
    a rear cover combined with the front cover with the display disposed therebetween;
    a skirt comprising a skirt body formed on a surface of one of the front cover and the rear cover to be coupled with a surface of the other one of the front cover and the rear cover in a combining direction, and an engaging slit formed on a surface of the skirt body and having a width in the combining direction and a length in a direction having an angle with the combining direction, the length longer than the width; and
    an engaging protrusion comprising a protrusion formed on a surface of the other one of the front cover and the rear cover and a slant slanting from the protrusion to the surface of the other one of the front cover and the rear cover such that the protrusion and the slant of the engaging protrusion are inserted into the engaging slit when the front cover and the rear cover are combined,
    wherein the engaging protrusion comprises at least one rib protruding from a surface of the engaging protrusion, and the protrusion, the slant, and the at least one rib of the engaging protrusion are inserted into the engaging slit.

7. The display apparatus according to claim 6, wherein the rib slants from the surface of the other one of the front cover and the rear cover to an end portion of the engaging protrusion.

8. The display apparatus according to claim 7, wherein the engaging slit slants at a predetermined angle corresponding to a slanting angle of the rib so as to engage the engaging protrusion.

9. The display apparatus according to claim 6, wherein a ratio between a width of the protrusion and a width of the slant is about 1.

10. The display apparatus according to claim 6, further comprising:
    a stopper protruding from one of the front cover and the rear cover so as to keep the front cover and the rear cover stopping at a combining position.

11. The display apparatus according to claim 6, further comprising:
    a jig accommodating part formed on the rear cover so as to accommodate a jig to separate the front cover from the rear cover.

12. The display apparatus according to claim 11, wherein the jig has a plate shape, has a smaller cross-section area than the jig accommodating part, and comprises a bent part in a center portion thereof to be inserted into a space between the front cover and the rear cover.

13. The display apparatus according to claim 11, wherein the jig comprises a jig protrusion protruding from a surface of the jig to allow the jig to be inserted into the jig accommodating part of the rear cover to stop at the jig accommodating part.

14. A display apparatus comprising a display unit to display an image thereon, comprising:
- a first cover;
- a second cover combined with the front cover to provide a space with the front cover to accommodate the display unit;
- a skirt comprising a skirt body formed on a first surface of the first cover in a combining direction when the front cover and the rear cover are combined in the combining direction, and an engaging slit formed on a surface of the skirt body in a direction having an angle with the combining direction; and
- an engaging protrusion comprising a protrusion formed on a surface of the second cover in the direction, and a slant slanting from a distal end of the protrusion to the surface of the second cover in the combining direction, such that the protrusion and the slant of the engaging protrusion are inserted into the engaging slit when the front cover and the rear cover are combined,
- wherein the engaging protrusion comprises at least one rib formed on the engaging protrusion in the direction.

15. The display apparatus according to claim 14, wherein the engaging slit has a width corresponding to the engaging protrusion and the slant in the direction, and a length corresponding to the engaging protrusion and the at least one rib so as to accommodates the protrusion, the slant, and the at least one rib of the engaging protrusion.

16. The display apparatus according to claim 15, wherein the at least one rib comprises an inclined surface having an angle with the surface of the second cover, and the engaging slit comprises a second inclined surface corresponding to the inclined surface of the at least one rib.

17. The display apparatus according to claim 14, wherein the engaging slit comprises an inclined surface corresponding to the slant of the protrusion.

18. The display apparatus according to claim 14, wherein the at least one rib comprises a plurality of ribs spaced-apart from each other in the direction.

19. The display apparatus according to claim 14, further comprising:
- a part formed on the first cover to apply a force to one of the first cover and the second cover in an opposite direction to the combining direction to separate the first cover and the second cover.

20. The display apparatus according to claim 14, further comprising:
- a part formed on the first cover to receive an external tool to be in contact with a component of the display unit,
- wherein the external tool applies a force with respect to a contact position of the component of the display unit to uncouple the engaging slit and the protrusion.

21. The display apparatus according to claim 20, wherein the component of the display unit comprises a shield to shield a circuit of the display unit.

22. The display apparatus according to claim 14, wherein the engaging slit comprises a plurality of slits spaced apart from each other in the direction, and the protrusion comprises a plurality of protrusions spaced apart from each other in the direction to be inserted into corresponding ones of the plurality of slits when the first cover and the second cover are combined in the combining direction.

23. An information processing apparatus having a circuit unit, comprising:
- a front cover to support the circuit unit;
- a rear cover to be combined with the front cover in a combining direction and having the circuit unit disposed therebetween;
- a skirt comprising a skirt body protruding from a surface of one of the front cover and the rear cover in the combining direction and an engaging slit formed on a surface of the skirt body in a direction having an angle with the combining direction;
- an engaging protrusion comprising a protrusion protruding from a surface of the other one of the front cover and the rear cover to engage the engaging slit of the skirt;
- a slant formed on the protrusion in the combining direction so that the front cover and the rear cover are smoothly detached and combined; and
- a rib formed on the protrusion.

24. The information processing apparatus having a circuit unit of claim 23,
- wherein the rib has a surface inclined in the combining direction.

* * * * *